United States Patent
Lee et al.

(12)
(10) Patent No.: US 6,289,290 B1
(45) Date of Patent: Sep. 11, 2001

(54) METHOD FOR ESTIMATING RADIATED EMISSION LEVEL FROM AN EUT AT AN ARBITRARY POSITION ON THE TURN TABLE AT OATS

(75) Inventors: Ae Kyoung Lee; Jae Hoon Yun; Kwang Yun Cho, all of Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 09/179,763

(22) Filed: Oct. 27, 1998

(30) Foreign Application Priority Data

Dec. 26, 1997 (KR) .................................................. 97-74744

(51) Int. Cl.$^7$ .................................................. G01R 27/02
(52) U.S. Cl. ........................... 702/57; 324/627; 324/628; 343/703
(58) Field of Search ........................... 324/95, 627, 635; 702/57, 40; 343/703; 333/34, 22 R, 243

(56) References Cited

U.S. PATENT DOCUMENTS 5,754,054 * 5/1998 Bergar .................................. 324/627
5,757,194 * 5/1998 Yun ...................................... 324/627

FOREIGN PATENT DOCUMENTS

PCT/US93/
 07556    3/1994  (EP) .

OTHER PUBLICATIONS

H. Stephen Berger, "Radiated Emissions Test Correlation Between G–Tem, Sac and Oats Facilities using Digital Phones", ©1993 IEEE, pp. 295–299.

Sreenivasiah et al., "Emission Characteristics of Electrically Small Radiating Sources From Test Inside a TEM Cell", ©1981 IEEE, pp. 113–121.

Edwin L. Bronaugh et al., "Radiated Emissions Test Performance of the GHz Tem Cell", ©1991 IEEE, pp. 1–7.

Hansen et al., "Stimulating Open Area Test Site Emission Measurements Based on Data Obtained in a Novel Broadband Tem Cell", ©1989 IEEE, pp. 171–177.

* cited by examiner

*Primary Examiner*—Kamini Shah
(74) *Attorney, Agent, or Firm*—Cohen, Pontani, Lieberman & Pavane

(57) ABSTRACT

A method for evaluating radiation electric fields using output port powers of GTEM cell to obtain correlation between GTEM cell and Open Area Test Site(hereinafter, called OATS) in order to simulate electromagnetic wave radiation emission more accurate than GTEM(Giga-hertz Transverse Electromagnetic; hereinafter, called GTEM) cell, one of replacing facilities of OATS, a test facility for evaluating radiation emission for a test of electromagnetic interference (EMI).

The adaption to a phase change of a dipole moment is very high by computing the electric field from a radiated matter using 15 GTEM cell output port powers as well as stably evaluating a radiation quantity upon considering the respective phase of the dipole illustrating an object due to various input values required in the algorithm.

10 Claims, 13 Drawing Sheets

The basic arrangement (XX',YY',ZZ')

The basic arrangement (X-Y',Y-Z',Z-X')

The basic arrangement (X-Z',Y-X',Z-Y')

FIG. 8c

| serial number | dipole moment | $P_x$ | $P_y$ | $P_z$ | $k_0M_x$ | $k_0M_y$ | $k_0M_z$ |
|---|---|---|---|---|---|---|---|
| 0 | | 0 | 0 | 0 | 0 | 0 | 0 |
| 1 | | 0 | 0 | 0 | 0 | 0 | 1 |
| 2 | | 0 | 0 | 0 | 0 | 1 | 0 |
| 3 | | 0 | 0 | 0 | 0 | 1 | 1 |
| 4 | | 0 | 0 | 0 | 1 | 0 | 0 |
| 5 | | 0 | 0 | 0 | 1 | 0 | 1 |
| ⋮ | | ⋮ | ⋮ | ⋮ | ⋮ | ⋮ | ⋮ |
| 61 | | 1 | 1 | 1 | 1 | 0 | 1 |
| 62 | | 1 | 1 | 1 | 1 | 1 | 0 |
| 63 | | 1 | 1 | 1 | 1 | 1 | 1 |

1:amplitude=$10^{-5}$, 0:amplitude=$10^{-10}$

FIG. 9e

| phase<br>serial number | $\psi_{px}$ | $\psi_{py}$ | $\psi_{pz}$ | $\psi_{mx}$ | $\psi_{my}$ | $\psi_{mz}$ |
|---|---|---|---|---|---|---|
| 0 | 5 | 5 | 5 | 5 | 5 | 5 |
| 1 | 5 | 5 | 5 | 5 | 5 | 95 |
| 2 | 5 | 5 | 5 | 5 | 5 | 185 |
| 3 | 5 | 5 | 5 | 5 | 5 | 275 |
| 4 | 5 | 5 | 5 | 5 | 95 | 5 |
| 5 | 5 | 5 | 5 | 5 | 95 | 95 |
| 6 | 5 | 5 | 5 | 5 | 95 | 185 |
| ⋮ | ⋮ | ⋮ | ⋮ | ⋮ | ⋮ | ⋮ |
| 99 | 5 | 5 | 95 | 185 | 5 | 275 |
| 100 | 5 | 5 | 95 | 185 | 95 | 5 |
| ⋮ | ⋮ | ⋮ | ⋮ | ⋮ | ⋮ | ⋮ |
| 211 | 5 | 5 | 275 | 95 | 5 | 275 |
| 212 | 5 | 5 | 275 | 95 | 95 | 5 |
| ⋮ | ⋮ | ⋮ | ⋮ | ⋮ | ⋮ | ⋮ |
| 310 | 5 | 95 | 5 | 275 | 95 | 185 |

METHOD FOR ESTIMATING RADIATED EMISSION LEVEL FROM AN EUT AT AN ARBITRARY POSITION ON THE TURN TABLE AT OATS

BACKGROUND OF THE INVENTION

1. Field of the Invention

The present invention relates to a method for estimating radiated emission level from an arbitrary EUT (Equipment under test) on the turn table at OATS (Open Area Test Site). More particular, the present invention relates to a method for estimating radiated emission level from an EUT at an arbitrary position on the turn table at OATS which obtains correlation between GTEM cell and OATS in order to simulate electromagnetic wave radiation emission more accurate than GTEM (Giga-hertz Transverse Electromagnetic) cell, one in the middle of replacing facilities of OATS, a test facility for evaluating radiation emission during a test of electromagnetic interference(EMI).

2. Discription of the Prior Art

1. The existing correlation algorithm

The existing correlation algorithm using GTEM cell was in detail explained in a paper P. Wilson, D, Hansen and D. Koenigstein, "Simulating open area test site emission measurements based on data obtained in a novel broadband TEM cell", in Proc. IEEE Nat. Symp. on Electromagn. Compat., Denver, Colo., May 1989, pp. 171–177 and "Method and apparatus for improved correlation of electromagnetic emission test data," please make reference to Application No. PCT/US 93/07556 filed on '93, 8, 11, Patent No. WO94/04933. The latter is an improved algorithm which connects a part searching a maximum value of voltage which an EUT in GTEM cell radiates at a front step of 3-input correlation algorithm to increase the accuracy of the former, 3-input correlation algorithm. Simply, it will be explained as follows.

First, algorithm of Wilson supposes that the phase of each component of dipole is identical for modelling the EUT as a dipole. The algorithm can be divided into two algorithms which are the correlation of 12-measurements, 12-inputs, and the correlation of 3-measurements, 3-inputs. The former can compute the electromagnetic wave radiation when we should know the respective components of the dipole illustrating the EUT, namely, $P_x$, $P_y$, $P_z$ of the electric dipole and $M_x$, $M_y$, $M_z$ of the magnetic dipole for expecting the radiation quantity. It appears to reflect the dipole component variously since the computing equation is complicated compared to the latter, the computing value can be a large error due to supposing that the dipole component is in-phase actually. The latter computes a radiation electric field with only a total radiation power from the test matter. The total radiation power requires only three transfer powers from the EUT in GTEM cell. There is the total radiation power achieved in the dipole moment amplitude value of 6 components as follows [Equation 1].

$$P_0 = 10k_0^2\{P_x^2 + P_y^2 + P_z^2 + k_o^2(M_x^2 + M_y^2 + M_z^2)\} \quad \text{[Equation 1]}$$

The three transfer powers referenced above are as follows [Equation 2].

$$P_1 = P_y^2 + k_0^2 M_x^2 \quad \text{[Equation 2]}$$
$$P_2 = P_z^2 + k_0^2 M_y^2$$
$$P_3 = P_x^2 + k_0^2 M_z^2$$

Further, these refers to the power of X, Y, Z. When a small electric dipole exists in a free space, the electric field from the dipole in the far-field zone $$E = E_\theta a_\theta = \frac{\eta_0 K_0}{4\pi} Idl \sin\theta \frac{e^{jk_0 r}}{r} a_\theta,$$

the total radiation power to this dipole $$P_0 = \frac{\eta_0 \pi}{3}\left(\frac{Idl}{\lambda}\right)^2.$$

Accordingly, $$E_\theta = 30\left(\frac{P_0}{10}\right)^{1/2} \sin\theta \frac{e^{-jk_0 r}}{r}.$$

Herein, based on that the total radiation power from the electric and magnetic dipole in arbitrary amplitude and directions is equal to the total radiation power from the electrically small electric dipole in z-direction. That is, supposing that the total radiation power expected from the GTEM cell is the radiation power from a single short dipole, in the case that one dipole moment is dominant, this shows an excellent model for the radiation of EUT. However, in the case that two or three moments are dominant, this model appears to be the worst case. When positioning this dipole on the grounded surface, measuring a horizontal electric field, the maximum couple happens when the dipole is positioned in horizontal, in the case of a vertical electric field, the maximum value will be received when the dipole is positioned vertically. The electric fields of two cases are as follows [Equation 3a] and [Equation 3b].

$$E_h = 30\left(\frac{P_0}{10}\right)^{1/2}\left[\frac{e^{-jk_0 r_1}}{r_1} - \frac{e^{-jk_0 r_2}}{r_2}\right] \quad \text{[Equation 3a]}$$

$$E_h = 30\left(\frac{P_0}{10}\right)^{1/2}\left[\frac{x^2}{r_1^2}\frac{e^{-jk_0 r_1}}{r_1} + \frac{x^2}{r_2^2}\frac{e^{-jk_0 r_2}}{r_2}\right] \quad \text{[Equation 3b]}$$

The 3-input correlation algorithm is used as most GTEM cell correlation algorithm used recently because of obtaining very simply radiation electric field. However, there may be critical errors in specific cases of dipole model.

Osburn algorithm is summarized into two embodiments so that firstly, the EUT is replaced with an actual dipole, E field equal to that from at the respective frequency can be measured, which is provided to apply on EMC standard regarding the power applied to the dipole as the computing value.

Supposition: the dipole, electric model of the EUT is supposed that all components are in-phase.

The voltage measurements of 12 times: 6-faces all measurements of a regular hexahedron wrapping the EUT under two polarizations.

After grasping the position (face & polarization) of the EUT emitting the maximum radiation quantity at the respective frequency from the 12 times measurement, the face & polarization of the EUT at that time are selected as the reference position, the maximum voltage is called X voltage.

Y and Z voltages relative to X voltage are obtained to have the input value of 3-input correlation algorithm.

To compute E field data, these three voltages are used to 3-input correlation algorithm of Wilson.

After computing E field, to compute the power provided to the dipole so that the radiation of identical E field occurs. This power is the value to indirectly compare with the standard limiting value. That is, the first embodiment becomes 12-measurement, 3-input correlation algorithm.

The second embodiment is to obtain the E field data to directly compare with the limiting value of the standard. This doesn't suppose that the EUT for all frequencies can be modelled by the dipole with gain not greater than the dipole. When this supposition is incorrect, the gain of the EUT is computed and used instead of the gain of radiation source in the 3-input correlation algorithm.

Voltage measurements of 12 times: being identical with first embodiment.

Reference Position: the same as the first embodiment.

There is obtained Y and Z voltages for 3-input correlation algorithm of Wilson.

Grasp whether the supposition of the dipole gain at the respective concern frequency is suitable or not. If it is suitable, there is used the supposition relative to the dipole gain in the correlation algorithm such as the first embodiment.

In the case of the frequency whose the supposition is not suitable, the additional measurement is performed at about 45° position from the reference face in the same polarization and at about 45° position from the reference face in another polarization. These measurements are used to obtain the evaluated value of the vertical and horizontal beam width. This gain evaluation replaces the gain value of the dipole in the correlation algorithm.

It is used to compute E field data, in the case that the dipole supposition is not achieved. The second embodiment becomes 16-measurement, 3-input correlation algorithm.

2. The problems of the existing embodiment relative to the correlation algorithm of GTEM cell and OATS.

Because 3-input correlation algorithm and John D. M. Osburn algorithm adding a routine finding a maximum transfer voltage in the front step basically suppose the dipole phase as the in-phase, they can have the error corresponded to it. Accordingly, if considering all phases of the dipole at power X, Y, Z, they are expressed as [Equation 4] as follows.

$$P_1 = P_y^2 + k_0^2 M_x^2 - 2k_0 P_y M_x \sin(\phi_{py} - \phi_{mx})$$ [Equation 4]

$$P_2 = P_z^2 + k_0^2 M_y^2 - 2k_0 P_z M_y \sin(\phi_{pz} - \phi_{my})$$

$$P_3 = P_x^2 + k_0^2 M_z^2 - 2k_0 P_x M_z \sin(\phi_{px} - \phi_{mz})$$

Accordingly, the total power has the error by [Equation 5] comparison [Equation 1] with [Equation 4].

$$2 0 k_0^3 P_y M_x \sin(\phi_{py} - \phi_{mx}) + P_z M_y \sin(\phi_{px} - \phi_{mz}) + P_x M_y \sin(\phi_{px} - \phi_{mz})$$ [Equation 5]

Furthermore, even though the total radiation power is accurate, this is a radiation from the electric and magnetic dipole with any direction, the computed value for the actual EUT can have the error in the most case that the EUT is not characterized by the vertical and horizontal electric dipole since this power in the 3-input correlation algorithm is supposed as the radiation quantity from a single short electric dipole.

SUMMARY OF THE INVENTION

It is an object of the present invention to provide a method for estimating radiated emission level when an EUT with wide differences between dipole moment components is at an arbitrary position on the turn table of OATS, using 15 output port powers of a GTEM cell and 15-measurement and 15-input algorithm.

In order to accomplish the above object, the present invention provides a method of evaluating radiation electric fields using an output port power of a GTEM cell comprising a method of evaluating radiation electric fields from an EUT in a GTEM cell upon replacing OATS, namely, facilities measuring a vertical and horizontal electric fields occurred from an EUT, said method comprises steps of: a first step of measuring 15 GTEM cell output port powers for 15 arrangements of the EUT in said GTEM cell; a second step of computing a correlation between vertical/horizontal electric field on OATS and the 15 GTEM output powers, and taking a maximum value of the the computed vertical/horizontal electric field values at spatial points measuring radiated emission level at the respective frequency.

BRIEF DESCRIPTION OF THE DRAWINGS

The above and other objects and features of the present invention will become apparent from the following description of preferred embodiments, when taken in conjunction with the accompanying drawings, in which:

FIGS. 7 to 9E are a theoretical consulting result to verify the validity of the present invention;

FIG. 7 is a theoretical comparative view of any EUT modelled with same amplitude and different phases at considered frequencies.

FIGS. 8A to 8C are theoretical comparative views of any EUT modelled with different amplitude and same phases at considered frequencies.

FIGS. 9A to 9E are theoretical comparative views of any EUT modelled with different amplitude and different phases at considered frequencies.

DETAILED DESCRIPTION OF THE PREFERRED EMBODIMENTS

Figure 1:
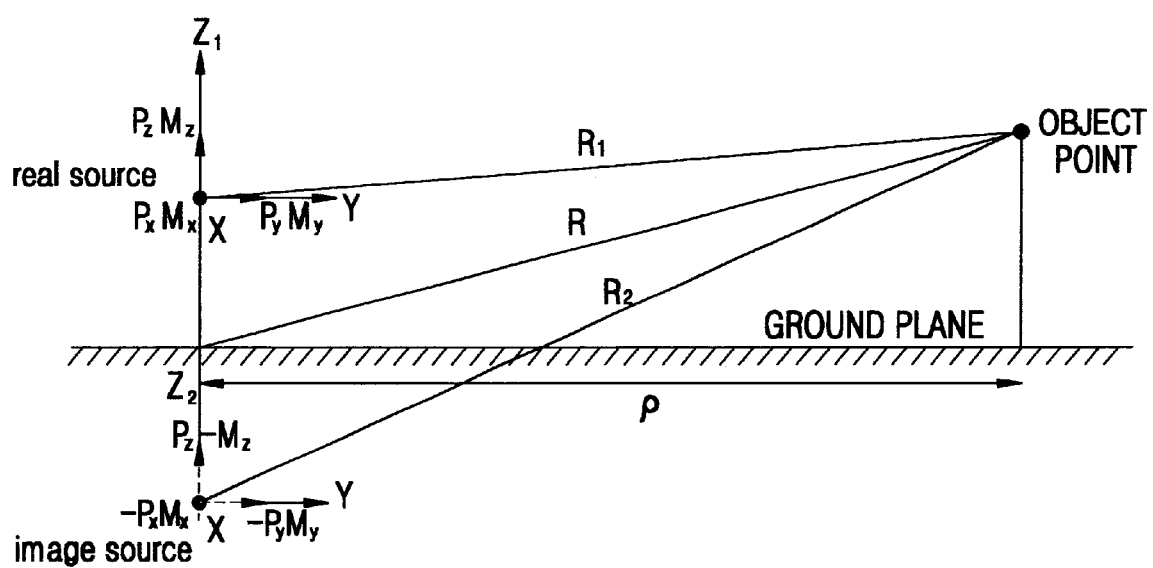
FIG. 1 shows a real source and image source for reflection from a ground plane.
Figure 2:
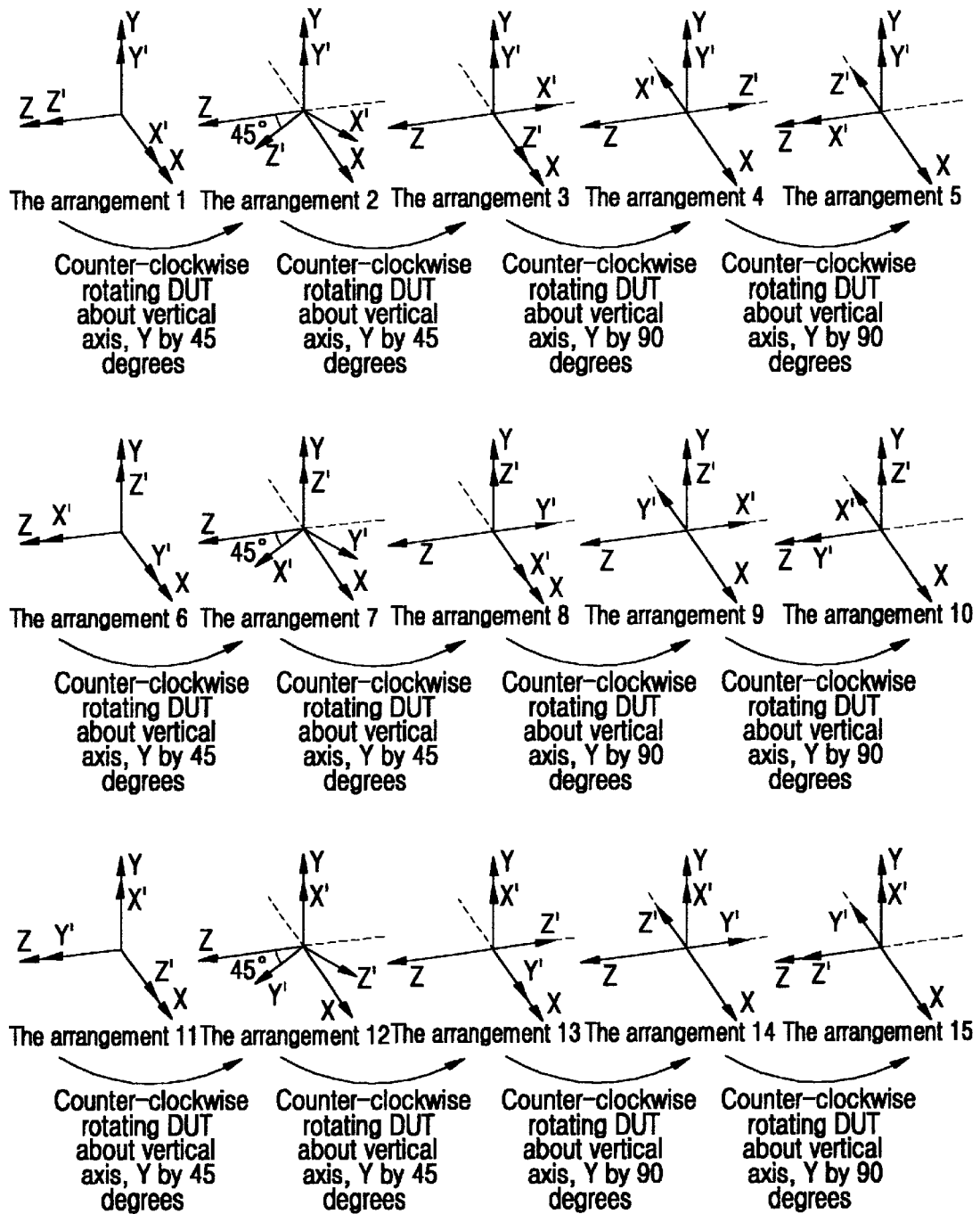
FIG. 2 shows arrangements of an EUT in GTEM cell.
Figure 6A:
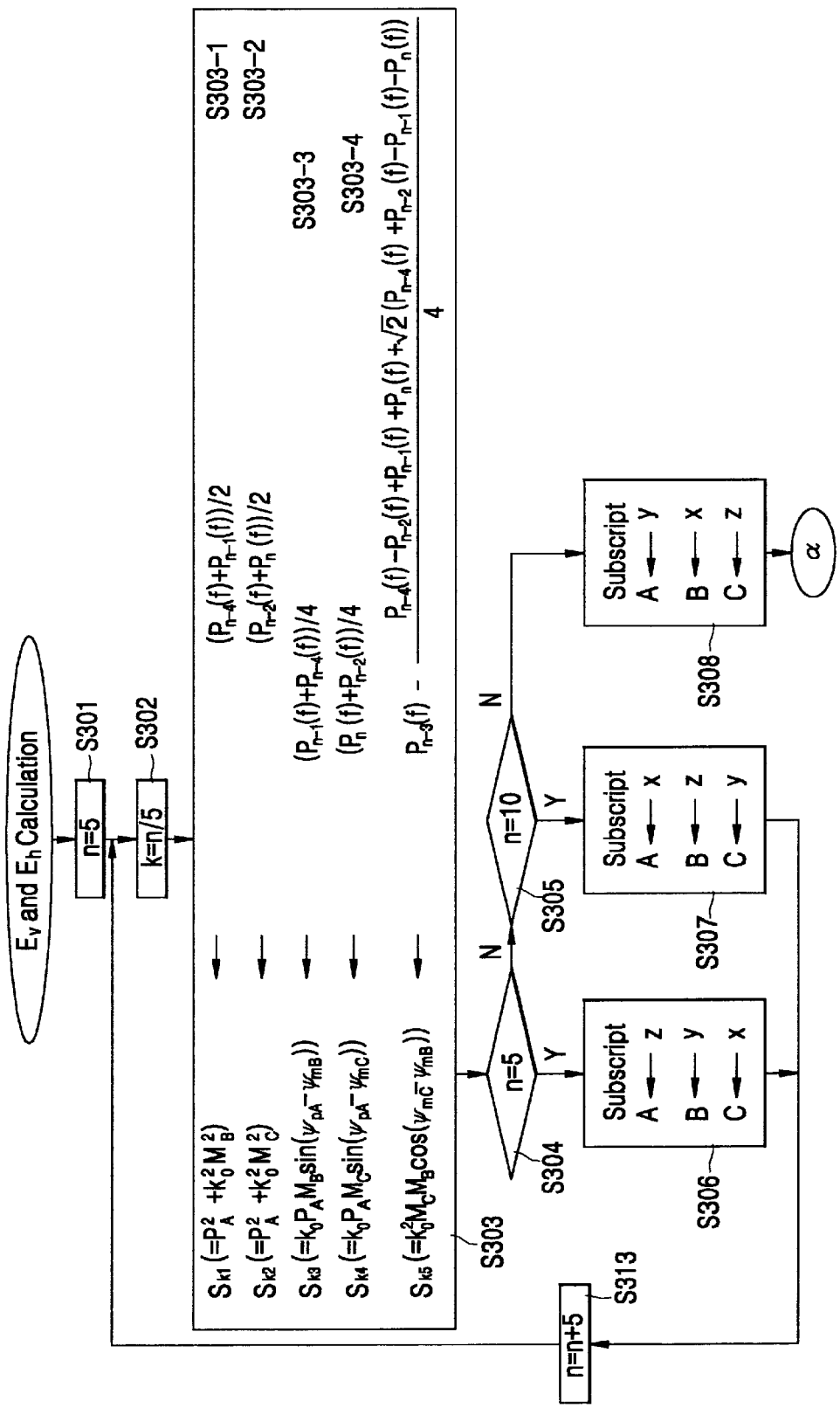
FIGS. 6A and 6B are flow charts to compute a vertical and horizonal radiation electric field.
Figure 6B:
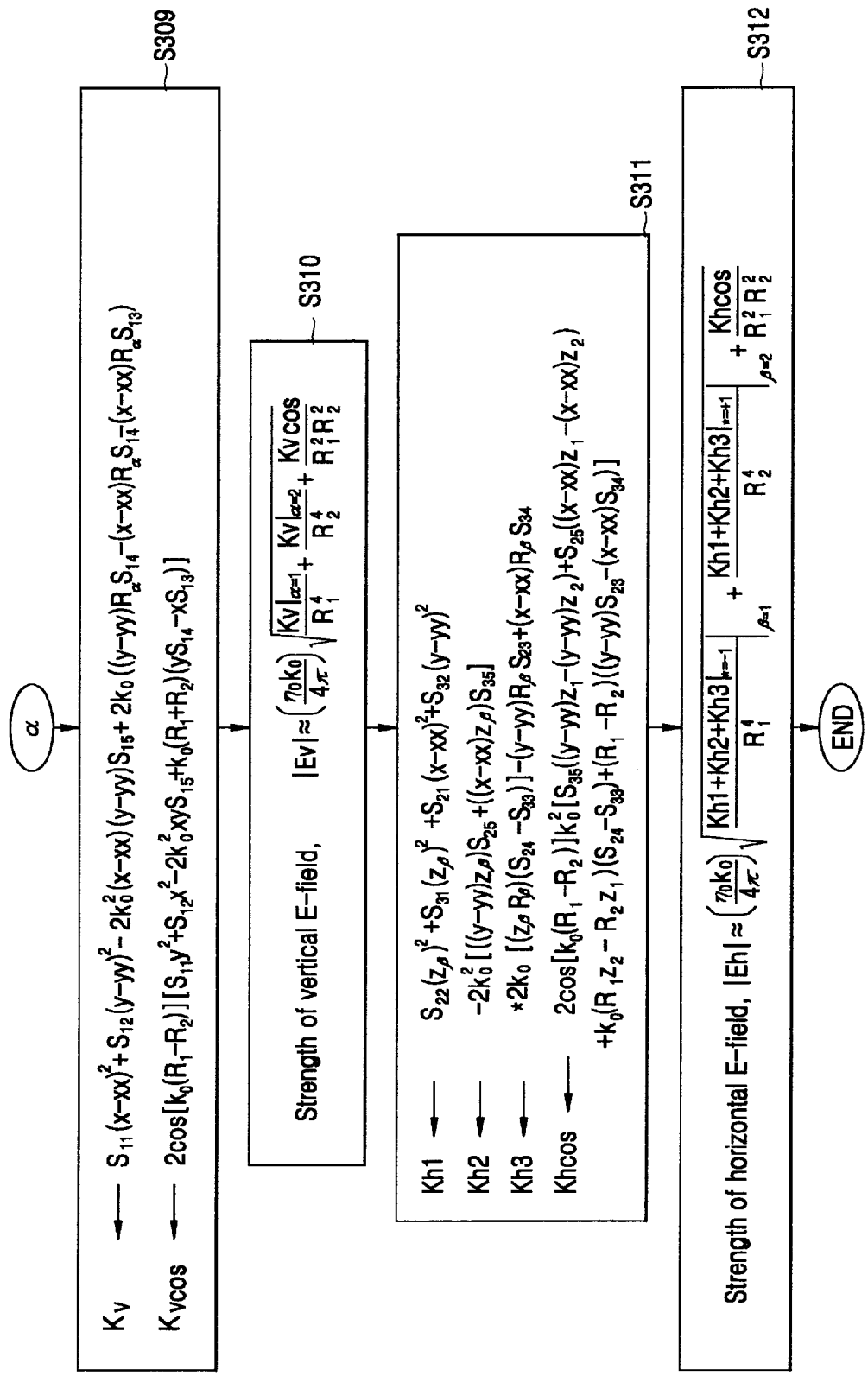

The present invention is largely constructed with FIGS. 2, 6A and 6B to embody the situation as shown in FIGS. 1A and 1B using GTEM cell without using the facilities such as the actual OATS(open area test site) or SAC(semi-anechoic chamber).

First, to obtain the radiated electric field of FIGS. 1A and 1B, there are required 15 powers measured at the GTEM cell output port for 15 directions of the EUT in the GTEM cell as FIG. 2. In addition, as in FIGS. 6A and 6B, the vertical and horizontal electric field radiated from the EUT is computed using 15 powers.

As computing as FIGS. 6A and 6B, the algorithm of the present invention has a very high correlation with measurement result of OATS as well as a very high adaptation to the various phase differences of the dipole moment, considering each phase of the dipole showing the object and accurately imitating arbitrary position of EUT which get off the center on turn table at OATS.

Since the conventional correlation algorithm unconditionally supposes that the EUT is accurately positioned in a center on turn table of OATS as well as disregards phase differences in electric model of entire EUTs, it has a disadvantage that the resultant errors can to be greater than the present invention.

Accordingly, the present invention suggests an applicable new algorithm in the case that the dipole model has any amplitude and phases and the EUT is not positioned in a center on turn table of OATS. The suggested algorithm requires 15 EUT arrangements, considers the phase differences between the dipole moment components. The radiation test result(GTEM data) using the GTEM cell is a value simulating a horizontal and vertical electric field from a set of dipole. It is related with 15 GTEM cell output port powers transferred from the object in the GTEM cell.

When the unit power is transferred to the output port of GTEM cell by the radiation theory from an electrically small current source in the waveguide(herein, GTEM cell), if the component y of the electric field of the dominant mode of the cell at the center position o of the EUT is $e_{oy}(o)$, GTEM cell output port power normalized as $e_{oy}(o)^2/4$ is as follows [Equation 6].

$$|a_0^-|^2 = |[P_y e^{j\psi_{py}} - jk_0 M_x e^{j\psi_{mx}}]|^2 \quad \text{[Equation 6]}$$

Herein, $P_y$ and $\psi_{py}$ are the amplitude and phases of the component y of the electric dipole moment P, $M_x$ and $\psi_{mx}$ the amplitude and phases of the component x of the electric dipole moment M. And $k_0$ is a free space electromagnetic wave constant.

The radiated electric field from the EUT expressed as the electric and magnetic dipole in far-zone as follows [Equation 7].

$$E \approx -j\omega A \approx -j\omega\mu_0 \frac{e^{-jk_0 r}}{4\pi r}[P - jk_0 a_r \times M] \quad \text{[Equation 7]}$$

Herein, n, $P = P_x e^{j\psi_{px}} a_x = P_y e^{j\psi_{py}} a_y = P_z e^{j\psi_{pz}} a_z$, $M = M_x e^{j\psi_{px}} a_x + M_y e^{j\psi_a}{}_y + M_z e^{j\psi_{pz}} a_z$, $a_x$, $a_y$, $a_z$ and $a_r$ are respectively the unit vectors of directions x, y, z, and r.

(1) The electric field on the ground plane.

The concern region where we want to know the radiation electric field value is on the ground plane as shown in FIG. 1A.

$R_1$ and $R_2$ of FIG. 1 are respectively distances from the real source and image source. The absolute value of the vertical and horizontal components of the electric field can be expressed as follows [Equation 8] and [Equation 9].

$$|E_v| = E_z \approx \quad \text{[Equation 8]}$$
$$\left| -j\omega\mu_0 \left\{ \frac{e^{-jk_0 R_1}}{4\pi R_1}[P_R - jk_0 \nabla R_1 \times M_R] + \frac{e^{-jk_0 R_2}}{4\pi R_2}[P_I - jk_0 \nabla R_2 \times M_I] \right\}_{z\,component} \right|$$

$$|E_h| \approx |E_\phi| = |-E_x \sin\phi + E_y \cos\phi| \quad \text{[Equation 9]}$$
$$= \left| \begin{array}{l} +j\omega\mu_0 \left\{ \frac{e^{-jk_0 R_1}}{4\pi R_1}[P_R - jk_0 \nabla R_1 \times M_R] + \frac{e^{-jk_0 R_2}}{4\pi R_2}[P_I - jk_0 \nabla R_2 \times M_I] \right\}_{x\,component} \sin\phi \\ -j\omega\mu_0 \left\{ \frac{e^{-jk_0 R_1}}{4\pi R_1}[P_R - jk_0 \nabla R_1 \times M_R] + \frac{e^{-jk_0 R_2}}{4\pi R_2}[P_I - jk_0 \nabla R_2 \times M_I] \right\}_{y\,component} \cos\phi \end{array} \right|$$

The above [Equation 8] and [Equation 9] are expanded in the equation including the dipole moment, however, unfortunately, a few terms of the expanded terms can not be obtained from the GTEM cell output port power. However, it can be disregarded in supposing that the measuring distance ρ is far larger compared to the height of the receiving antenna. In addition, as shown in FIG. 1B, when radiation emission is measured, there are many case which the positon of EUT get off the center of turn table among the test references. Accordingly, under considering this case, the radiation emission of the ground plane can be obtained by computing the following [Equation 10] and [Equation 11].

The above contents are illustrated in detail, as follows.

When the radiation emission is measured according to CISPR standard or FCC standard, the EUT is positioned on the edge of turn table for fixing a signal line or power line from the EUT on turn table of OATS or SAC. Since the distance between the EUT and the antenna in 3 m (measurement distance) is nearer than 10 m or 30 m, the test position is sensitively influenced by position change of the EUT. For example, suppose that the EUT is positioned as shown in FIG. 1B. At this time, if the measurement distance is 3 m, xx is 0.1 m, and yy is 0.4 m, real measurement distance in current measurement distance is $\sqrt{0.1^{2+(3+0.4)^2}} \approx 3.4$ m. And then the measurement distance in the state which the turn table is rotated in a 180-degree arc from this position is 2.6 m. Accordingly, Since there is a wide differene (0.8 m error) between the measurement distances in the measurement of one EUT, the problem can be occurred by correlation using 3 m measurement result as the GTEM output power. Therefore, the present invention proposes the following [Equation 10] and [Equation 11] to solve the above problem.

[Equation 10]

$$|E_v|^2 \approx \left\{\frac{\eta_0 k_0}{4\pi}\right\}^2 \{K_v\}, \text{ herein, } K_v = K_{vR_1} + K_{vR_2} + K_{vcos}$$

$$K_{vR_1} = \frac{1}{R_1^2}\left[\begin{array}{c}(p_z^2 + k_0^2 M_x^2)\left(\frac{(y-yy)}{R_1}\right)^2 + (P_z^2 + k_0^2 M_y^2)\left(\frac{(x-xx)}{R_1}\right)^2 - \\ 2k_0^2 \frac{(x-xx)(y-yy)}{R_1^2} M_x M_y C_{mxy} + 2k_0\left(\frac{(y-yy)}{R_1} P_z M_x S_{zx} - \frac{(x-xx)}{R_1} P_z M_y S_{zy}\right)\end{array}\right]$$

$$K_{vR_2} = \frac{1}{R_2^2}\left[\begin{array}{c}(p_z^2 + k_0^2 M_x^2)\left(\frac{(y-yy)}{R_2}\right)^2 + (P_z^2 + k_0^2 M_y^2)\left(\frac{(x-xx)}{-R_2}\right)^2 - \\ 2k_0^2 \frac{(x-xx)(y-yy)}{R_2^2} M_x M_y C_{mxy} + 2k_0\left(\frac{(y-yy)}{R_2} P_z M_x S_{zx} - \frac{(x-xx)}{R_2} P_z M_y S_{zy}\right)\end{array}\right]$$

$$K_{vcos} = 2\cos[k_0(R_1 - R_2)]\left(\frac{1}{R_1 R_2}\right)^2 \cdot \left[\begin{array}{c}(p_z^2 + k_0^2 M_x^2)(y-yy)^2 + (P_z^2 + k_0^2 M_y^2)(x-xx)^2 - 2k_0^2(x-xx)(y-yy)M_x M_y C_{mxy} + \\ k_0(R_1 + R_2) \cdot ((y-yy)P_z M_x S_{zx} - (x-xx)P_z M_y S_{zy})\end{array}\right]$$

[Equation 11]

$$|E_h|^2 \approx \left\{\frac{\eta_0 k_0}{4\pi}\right\}^2 \{K_h\}, \text{ herein, } K_h = K_{hR_1} + K_{hR_2} + K_{hcos}$$

$$K_{hR_1} = \frac{1}{R_1^2}\left[\begin{array}{c}(P_x^2 + k_0^2 M_y^2)\left(\frac{z_1}{R_1}\right)^2 + (P_y^2 + k_0^2 M_x^2)\left(\frac{z_1}{R_1}\right)^2 + \\ (P_x^2 + k_0^2 M_z^2)\left(\frac{(x-xx)}{R_1}\right)^2 + (P_y^2 + k_0^2 M_z^2)\left(\frac{(y-yy)}{R_1}\right)^2 - \\ 2k_0^2\left(\frac{(y-yy)z_1}{R_1^2} M_y M_z C_{myz} + \frac{(x-xx)z_1}{R_1^2} M_x M_z C_{mxz}\right) + \\ 2k_0\left(\begin{array}{c}\frac{z_1}{R_1}(P_x M_y S_{xy} - P_y M_x S_{yx}) - \\ \frac{(y-yy)}{R_1} P_x M_z S_{xz} + \frac{(x-xx)}{R_1} P_y M_z S_{yz}\end{array}\right)\end{array}\right]$$

$$K_{hR_2} = \frac{1}{R_2^2}\left[\begin{array}{c}(P_x^2 + k_0^2 M_y^2)\left(\frac{z_2}{R_2}\right)^2 + (P_y^2 + k_0^2 M_x^2)\left(\frac{z_2}{R_2}\right)^2 + \\ (P_x^2 + k_0^2 M_z^2)\left(\frac{(x-xx)}{R_2}\right)^2 + (P_y^2 + k_0^2 M_z^2)\left(\frac{(y-yy)}{R_2}\right)^2 + \\ 2k_0^2\left(\frac{(y-yy)z_2}{R_2^2} M_y M_z C_{myz} + \frac{(x-xx)z_2}{R_2^2} M_x M_z C_{mxz}\right) + \\ 2k_0\left(\begin{array}{c}\frac{z_2}{R_2}(P_y M_x S_{yx} - P_x M_y S_{xy}) - \\ \frac{(y-yy)}{R_2} P_x M_z S_{xz} + \frac{(x-xx)}{R_2} P_y M_z S_{yz}\end{array}\right)\end{array}\right]$$

$$K_{hcos} = 2\cos[k_0(R_1 - R_2)]\left(\frac{1}{R_1 R_2}\right)^2 \cdot$$

$$\left[\begin{array}{c}k_0^2[M_x M_z C_{myz}((y-yy)z_1 - (y-yy)z_2) + M_x M_y C_{mxy}((x-xx)z_1 - (y-yy)z_2)] + \\ k_0(R_1 z_2 - R_2 z_1) \cdot (P_x M_y S_{xy} - P_y M_x S_{yx}) + \\ (R_1 + R_2)((y-yy)P_x M_z S_{xz} - (x-xx)P_y M_z S_{yz})\end{array}\right]$$

$\eta_0$ and $k_0$ are respectively wave impedance and propagation constant in free space in the [Equation 10] and [Equation 11].

$$z_1 = z-h, \ z_2 = z+h, \ C_{mab} = \cos(\psi_{ma} - \psi_{mb}), \ S_{sb} = \sin(\psi_{pa} - \psi_{mb})..$$

Herein, the subscripts a and b are x, y or z.

(2) The direction of EUT

The coordinate system(x, y, z) and prime coordinate system(x', y', z') illustrate the coordinate system of the GTEM cell and EUT respectively. The 15 positions of the EUT in the GTEM cell required in the present correlation algorithm are shown in FIG. 2, set by rotating the object relative to the GTEM cell vertical axis. The dipole moments of [Equation 10] and [Equation 11] are obtained with the GTEM cell output port powers for 15 positions.

Figure 3:
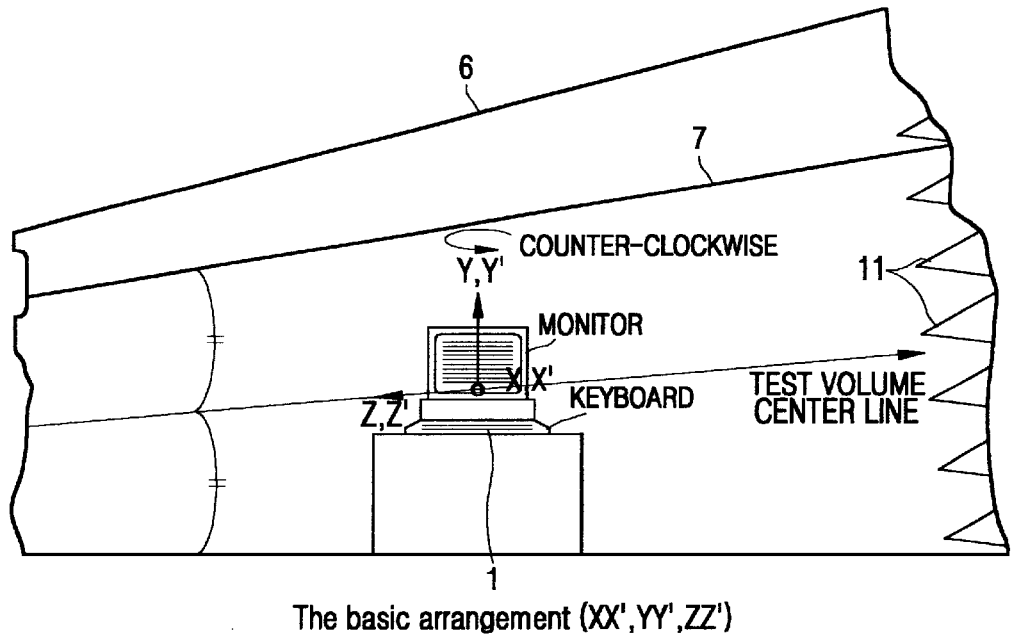
FIG. 3 shows a basic arrangement (XX', YY', ZZ') of an EUT in GTEM cell.
Figure 4:
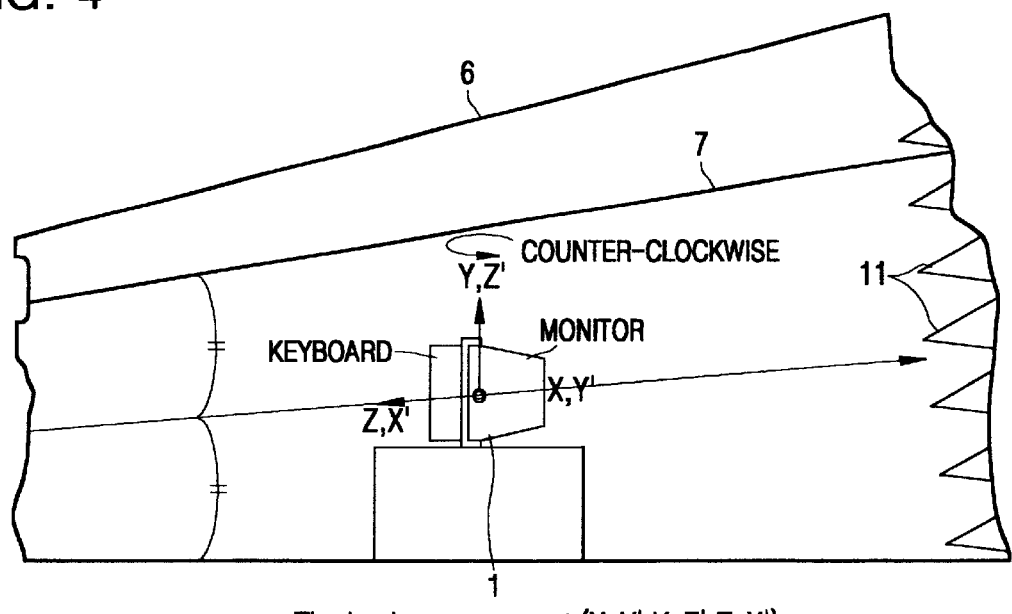
FIG. 4 shows a basic arrangement (XY', YZ', ZX') of an EUT in GTEM cell.
Figure 5:
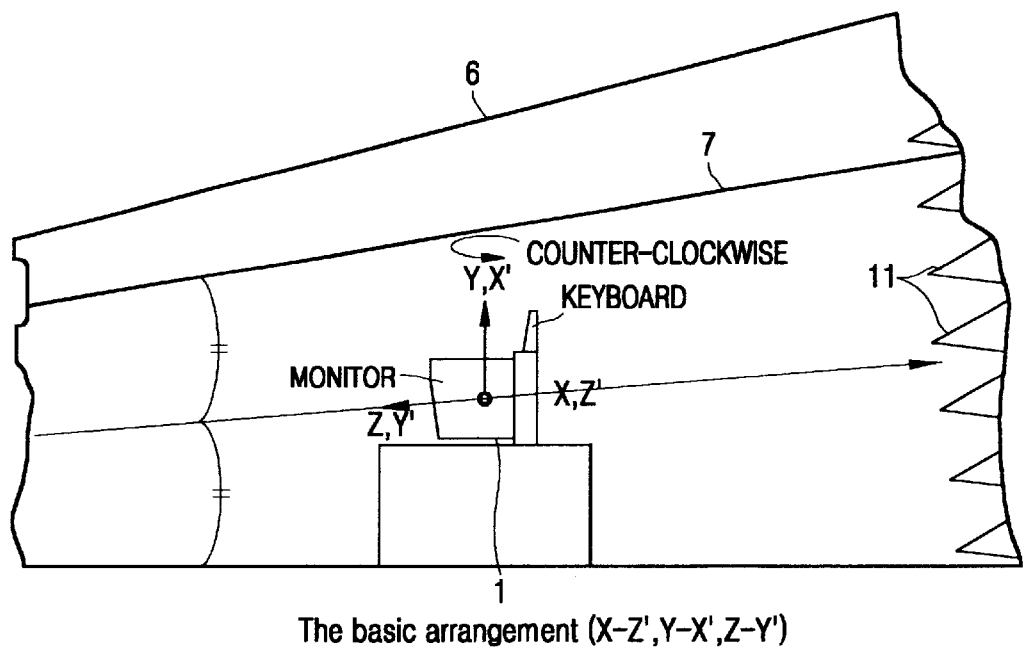
FIG. 5 shows a basic arrangement (XZ', YX', ZY') of an EUT in GTEM cell.

To obtain the vertical electric field of [Equation 10], 5 measurements are required with the basic arrangement(xx', yy', zz'). FIGS. 3 and 4 and 5 show the three basic arrangements of the EUT( for example, computer) in the GTEM cell to obtain the vertical electric field and horizontal electric field. The basic arrangement(xx', yy', zz') means that the EUT coordinate system(x', y', z') accords with the GTEM cell coordinate system(x, y, z), this arrangement corresponds to a first arrangement of FIG. 2. The EUT is positioned according to this basic arrangement, 5 counterclockwise rotations of the EUT about the vertical axis are performed. The 5 rotation angles are 0° (i=1), 45° (i=2), 90° (i=3), 180° (i=4), and 270° (i=5). The first arrangement to the fifth arrangement of FIG. 2 show the directional relation between the GTEM cell and EUT for 5 rotations. The normalized GTEM cell output port power $P_i(f)$ relative to the rotational angle $\phi$ is as follows [Equation 12].

$$P_i(f) = P_y^2$$
$$+ k_0^2[M_{z'}^2 S^2\phi_i + 2M_zM_xC_{mz'x'}C\phi_i S\phi_i]$$
$$- 2k_0[P_yM_xM_{x'}S_{yx'}C\phi_i + P_yM_zS_{yz'}S\phi_i] \quad \text{[Equation 12]}$$

Herein, $C\phi_i = \cos\phi_i$, $S\phi_i = \sin\phi_i$.

The horizonal electric field of [Equation 11] requires 2 the basic arrangements(xy', yz', zx') and (xz', yx',zy') of FIGS. 4 and 5. When measuring, the rotational angle is identical to the case of the vertical electric field. The coordinate arrangements of 5 rotational states relative to the basic arrangements(xy', yz', zx') and (xz', yx', zy') are respectively the sixth arrangement to the tenth arrangement and the eleventh arrangement to the fifth arrangement of FIG. 2 The normalized power for the rotational angle $\phi_i$ of 2 basic arrangements is as follows [Equation 13a] and [Equation 13b].

$$P_i(f) = P_z^2 \quad \text{[Equation 13a]}$$
$$k_0^2[M_x^2C^2\phi_i + M_z^2S^2\phi_i + 2M_zM_xC_{mz'x'}C\phi_i S\phi_i]$$
$$-2k_0[P_zM_yS_{zy'}C\phi_i + P_zM_xS_{zx'}S\phi_i]$$

$$P_i(f) = P_x^2 \quad \text{[Equation 13b]}$$
$$+k_0^2[M_z^2C^2\phi_i + M_y^2S^2\phi_i + 2M_yM_zC_{my'z'}C\phi_i S\phi_i]$$
$$-2k_0[P_xM_zS_{x'z'}C\phi_i + P_xM_yS_{x'y'}S\phi_i]$$

(3) The correlation between the GTEM cell output port powers and radiation electric fields on the ground plane.

The dipole moment terms of [Equation 10] to obtain the vertical radiated electric field are composed of 5 GTEM cell output port powers, can be expressed as the following [Equation 14a] and [Equation 14b].

$$P_z^2 + k_0^2 M_y^2 = \frac{P_1(f) + P_4(f)}{2} \quad \text{[Equation 14a]}$$

$$P_z^2 + k_0^2 M_x^2 = \frac{P_3(f) + P_5(f)}{2} \quad \text{[Equation 14b]}$$

$$k_0 P_z M_y(\Psi_{pz} - \Psi_{my}) = \frac{P_4(f) - P_1(f)}{4} \quad \text{[Equation 14c]}$$

$$k_0 P_z M_x(\Psi_{pz} - \Psi_{mx}) = \frac{P_5(f) - P_3(f)}{4} \quad \text{[Equation 14d]}$$

$$k_0^2 M_x M_y \cos(\psi_{mx} - \psi_{my}) = \quad \text{[Equation 14e]}$$
$$P_2(f) - \frac{P_1(f) + P_3(f) + P_4(f) + P_5(f) + \sqrt{2(P_1(f) + P_3(f) - P_4(f) - P_5(f))}}{4}$$

As expected, the dipole moment of the horizontal electric field of [Equation 11] can be expressed as the terms of 10 GTEM cell output port powers $P_6(f) \sim P_{15}(f)$, the following [Equation 15a]~[Equation 15j] are expressed as follows.

$$P_x^2 + k_0^2 M_z^2 = \frac{P_6(f) + P_9(f)}{2} \quad \text{[Equation 15a]}$$

$$P_x^2 + k_0^2 M_y^2 = \frac{P_8(f) + P_{10}(f)}{2} \quad \text{[Equation 15b]}$$

$$k_0 P_x M_z \sin(\Psi_{px} - \Psi_{mx}) = \frac{P_9(f) - P_6(f)}{4} \quad \text{[Equation 15c]}$$

$$k_0 P_x M_y \sin(\Psi_{px} - \Psi_{my}) = \frac{P_{10}(f) - P_8(f)}{4} \quad \text{[Equation 15d]}$$

$$k_0^2 M_y M_z \cos(\psi_{my} - \psi_{ma}) = \quad \text{[Equation 15e]}$$
$$P_7(f) - \frac{P_6(f) + P_8(f) + P_9(f) + P_{10}(f) + \sqrt{2(P_6(f) + P_8(f) - P_9(f) - P_{10}(f))}}{4}$$

$$P_y^2 + k_0^2 M_x^2 = \frac{P_{11}(f) + P_{14}(f)}{2} \quad \text{[Equation 15f]}$$

$$P_y^2 + k_0^2 M_z^2 = \frac{P_{13}(f) + P_{15}(f)}{2} \quad \text{[Equation 15g]}$$

$$k_0 P_y M_x \sin(\Psi_{py} - \Psi_{py}) = \frac{P_{14}(f) - P_{11}(f)}{4} \quad \text{[Equation 15h]}$$

$$k_0 P_y M_z \sin(\Psi_{py} - \Psi_{mx}) = \frac{P_{15}(f) - P_{13}(f)}{4} \quad \text{[Equation 15i]}$$

$$k_0^2 M_x M_z \cos(\psi_{mx} - \psi_{mz}) = \quad \text{[Equation 15j]}$$
$$P_{12}(f) - \frac{P_{11}(f) + P_{13}(f) + P_{14}(f) + P_{15}(f) + \sqrt{2(P_{11}(f) + P_{13}(f) - P_{14}(f) - P_{15}(f))}}{4}$$

The dipole moment terms of [Equation 11]and [Equation 12]can be replaced with [Equation 14a]~[Equation 14e] and [Equation 15a]~[Equation 15j]. That is, [Equation 14a]~[Equation 14e] and [Equation 15a]~[Equation 15j] are Equations correlative to the radiated electric field from the EUT on the ground plane and GTEM cell output port power. That is, if [Equation 14a]~[Equation 14e] and [Equation 15a]~[Equation 15j] are substituted for [Equation 11] and [Equation 12], there can be obtained the consulted radiation electric field. This computing procedure is in detail shown in FIGS. 6(*a*) and 6(*b*).

The subscripts 1~15 of $P_1(f) \sim P_{15}(f)$ in FIGS. 6(*a*) and 6(*b*) are the arrangement numbers of the first ~ the fifteenth arrangements, when n=5, the basic arrangement is (XX', YY', ZZ'), when n=10, (XY', YZ', ZX'), and when n=15, (XZ', YX', ZY'). Accordingly, when n=5, the steps S303-1~S303-5 of FIG. 6(*a*) are corresponded to [Equation 14a]~

[Equation 14e], when n=10, 15, the steps S303-1~S303-5 of FIG. 6(a) are respectively accorded with [Equation 15a]~[Equation 15e] and [Equation 15f]~[Equation 15j].

For the radiated emission test of EMI, it has been examined whether the electric field computed as FIGS. 6(a) and 6(b) stably estimates the radiation quantity and the adaptation to the phase variable of the dipole moment is high.

In the case of measuring the actual object, since the object power line arrangement in the GTEM cell considerably are different from the arrangement state of SAC, or all the errors of the measurement itself are included, the effect of the computing method of the present invention can not be accurately decided. Therefore, to exclude the various measurement errors as above, compare and examine the suggested algorithm accuracy with the theoretical value by means of [Equation 8] and [Equation 9] theoretically not approximated to [Equation 3] in the middle of the existing algorithms, several sets of the electric and magnetic moments are supposed theoretically. The theoretical value in the result graph is obtained from [Equation 8] and [Equation 9] considering all amplitudes and phases of the dipole moments, the value by means of the previous algorithm is to use [Equation 3]. The algorithm according to the present invention is obtained from using [Equation 10] and [Equation 11].

Such a result is compared in FIG. 7, FIGS. 8(a) to 8(c), and FIGS. 9(a) to 9(f). The respective value is a maximum value of computed values at the observing points in the range of $\phi=0°$ through $360°$ (step $20°$), z=1 through 4 m (step 20 cm), and $\rho=3$ m. The cases of dipole sets used are as follows.

Figure 7:
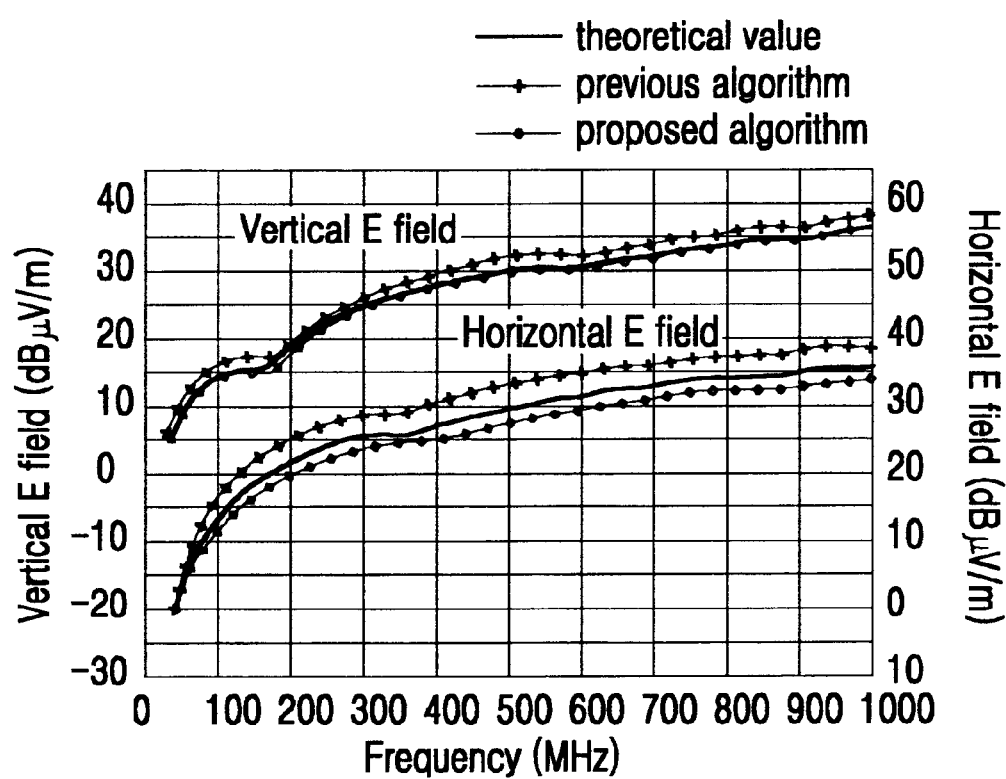

The case 1:
$P_x=P_y=P_z=k_0M_x=k_0M_y=k_0M_z$, $\psi_{px}=\psi_{py}=\psi_{pz}=\psi_{mx}=\psi_{my}=\psi_{mz}$ The case 2:
$P_x\neq P_y\neq P_z\neq k_0M_x\neq k_0M_y\neq k_0M_z, \psi_{px}=\psi_{py}=\psi_{pz}=\psi_{mx}=\psi_{my}=\psi_{mz}$ The case 3:
$P_x=P_y=P_z=k_0M_x=k_0M_y=k_0M_z$,
$\psi_{px}\neq\psi_{py}\neq\psi_{pz}\neq\psi_{mx}\neq\psi_{my}\neq\psi_{mz}$ The simulated result of the case 1 is shown in FIG. 7. The difference between the present algorithm and theoretical value is within 2.5 dB. Particularly, the vertical electric field accords with the theoretical value at all frequency. The data using the previous algorithm shows a comparative preferred accordance.

Figure 8A:
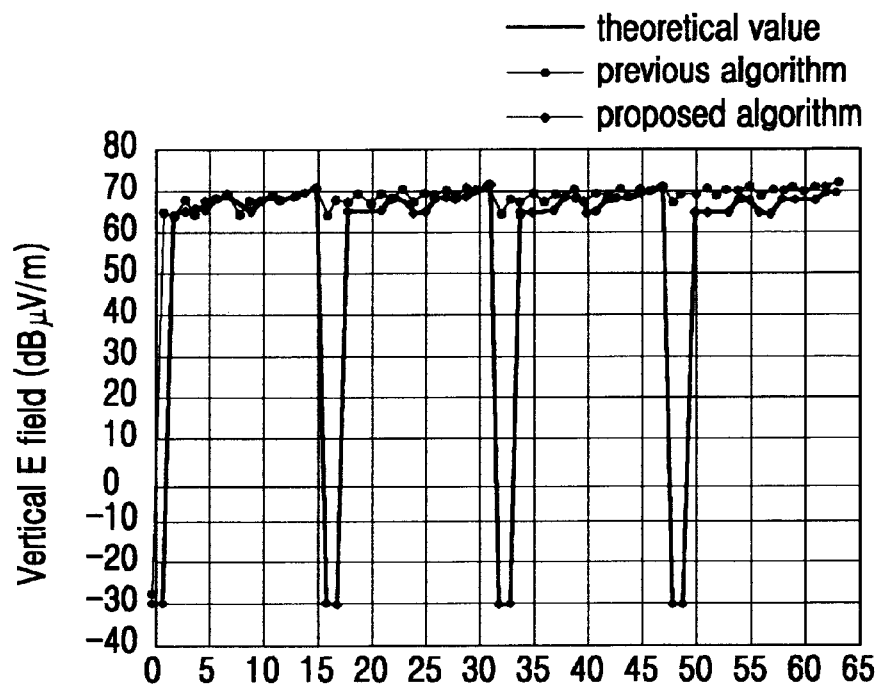
Figure 8B:
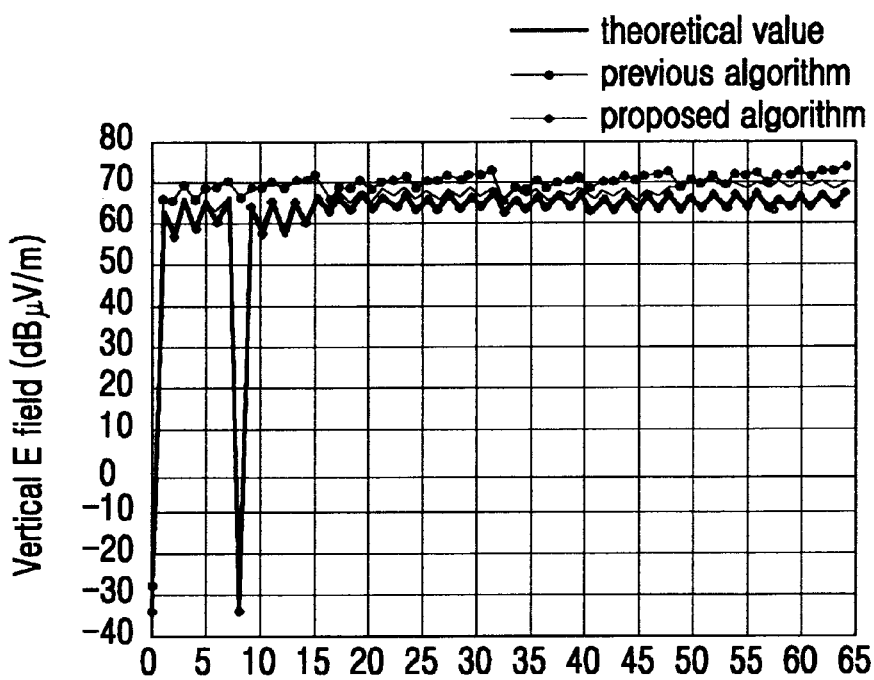
Figure 9A:
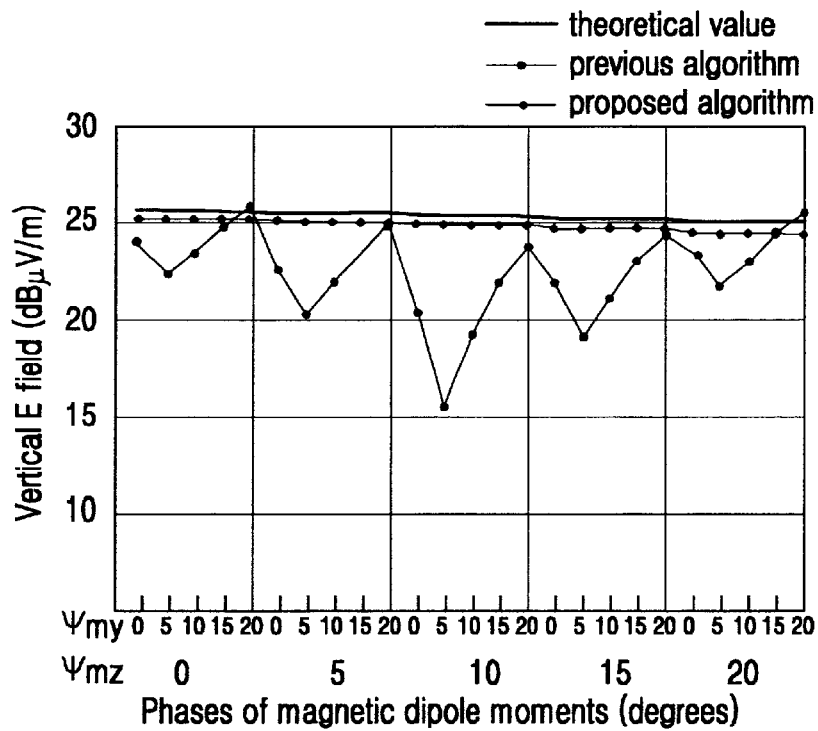
Figure 9B:
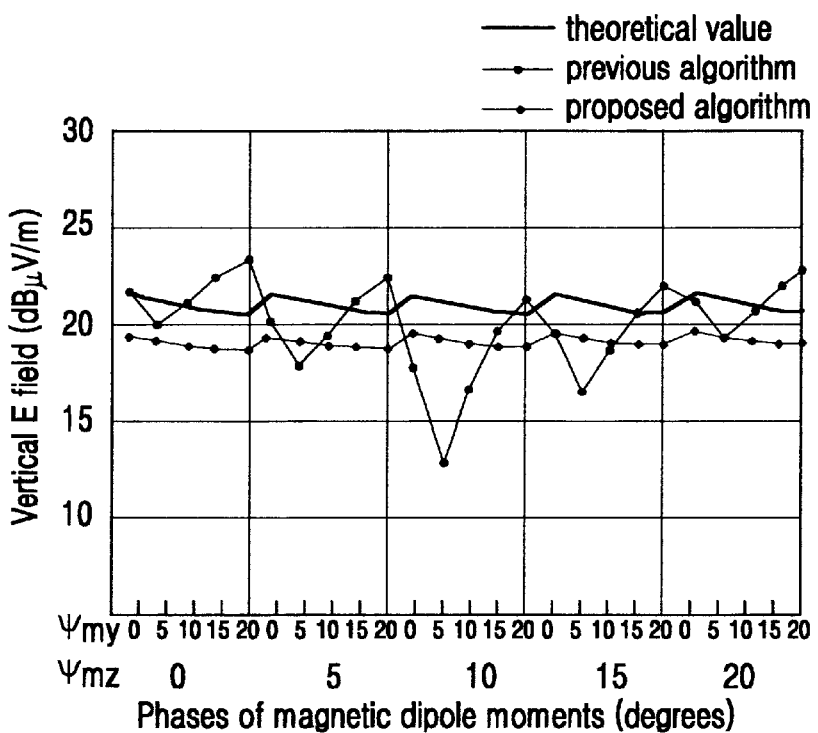
Figure 9C:
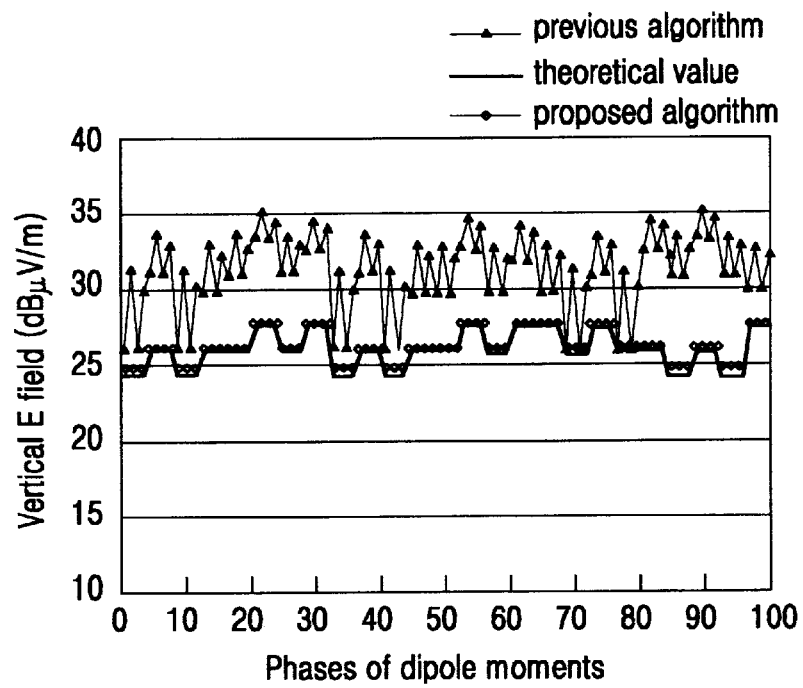
Figure 9D:
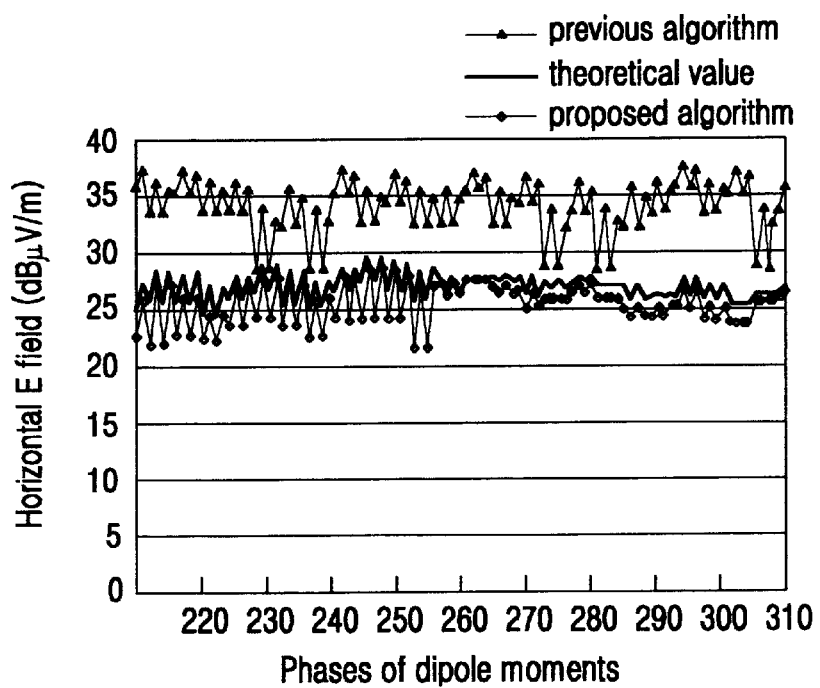

FIGS. 8A to 8C show the simulated result of the radiated electric field from the dipole moment of the case 2. The labels of the horizontal axis show the amplitude.

The two data of the vertical electric field by means of the present algorithm show an excellent accordance. However, the data of the horizontal electric field accord within about 5 dB. The data using the previous algorithm show a very large error in sets of dipole of special amplitudes (the case of vertical electric field: in the order of 1, 16, 17, 32, 33, the case of vertical electric field: in the order of 8). FIGS. 9A to 9F show the simulated result for the phase variation of the dipole moment component. Since the number of set of the phase variaton of 6 dipole moments is too a lot (for example, the dipole moment phase set considered is $1.4\times10^{11}$ in the phase variable step of FIG. 5), only the limited cases are computed in the present invention. As decided from the result, the vertical electric field data shows an excellent accordance similar to two cases as above, in the horizontal electric field, a narrow phase difference and large phase difference respectively accord within 2 dB and 4 dB. The horizontal axial label of FIG. 8B shows the phase set.

Figure 10:
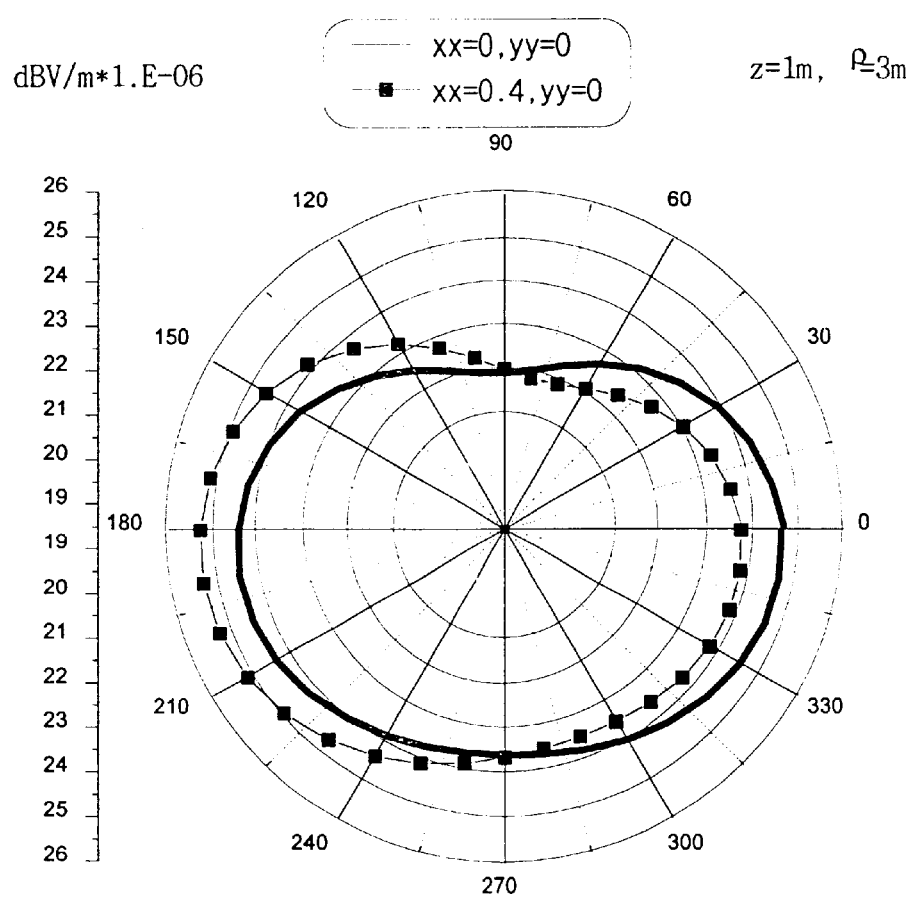
FIG. 10 shows comparison of radiation patterns according to positon of EUT on turn table.

FIG. 10 shows one embodyment according to the position of the EUT postioned on turn table of OATS or SAC.

As described above, although the present invention has been described in detail with reference to illustrative embodiments, the invention is not limited thereto and various modifications and changes may be effected by one skilled in the art within the scope of the invention.

What is claimed is:

1. A method for estimating radiated emission level from an EUT at an arbitrary position on the turn table at OATS comprising a method for evaluating radiated electric fields from an EUT using a GTEM cell upon replacing OATS, namely, facilities measuring a vertical and horizontal electric fields occurred from an electric and magnetic instrument (EUT), said method comprises steps of:

a first step of measuring 15 GTEM cell output port powers for 15 arrangements devised of the EUT in said GTEM cell;

a second step of computing a correlation between vertical and horizontal electric field equations radiated from said EUT on OATS and said 15 GTEM cell output port powers and taking a maximum value of computed vertical and horizontal electric field values radiated from said EUT on said OATS in the range of spatial point measuring an electromagnetic interference at the respective frequency.

2. The method for estimating radiated emission level from an EUT at an arbitrary position on the turn table at OATS according to claim 1, wherein said 15 arrangement methods relative to a measuring variable n of the EUT in the GTEM cell of said first step is that when a coordinate axis of the GTEM cell is (X, Y, Z) and a coordinate axis of the EUT is (X', Y', Z'), 15 arrangements relative to said measuring variable n are respectively arranged as below:

a first arrangement: an arrangement respectively according the GTEM cell coordinate axes X, Y, and Z with the EUT coordinate axes X', Y', and Z', which is called a basic arrangement (XX', YY', ZZ');

a second arrangement: an arrangement rotating the EUT by 45 degree in the counter-clockwise about Y-axis in said first arrangement;

a third arrangement: an arrangement rotating the EUT by 45 degree in the counter-clockwise about Y-axis in said second arrangement;

a fourth arrangement: an arrangement rotating the EUT by 90 degree in the counter-clockwise about Y-axis in said third arrangement;

a fifth arrangement: an arrangement rotating the EUT by 90 degree in the counter-clockwise about Y-axis in said fourth arrangement;

a sixth arrangement: an arrangement respectively according GTEM cell coordinate axes X, Y, and Z with the EUT coordinate axes X', Y', and Z', which is called a basic arrangement (XY', YZ', ZX');

a seventh arrangement: an arrangement rotating the EUT by 45 degree in the counter-clockwise about Y-axis in said sixth arrangement;

an eighth arrangement: an arrangement rotating the EUT by 45 degree in the counter-clockwise about Y-axis in said seventh arrangement;

a ninth arrangement: an arrangement rotating the EUT by 90 degree in the counter-clockwise about Y-axis in said eighth arrangement;

a tenth arrangement: an arrangement rotating the EUT by 90 degree in the counter-clockwise about Y-axis in said ninth arrangement;

an eleventh arrangement: an arrangement respectively according GTEM cell coordinate axes X, Y, and Z with the EUT coordinate axes Z', X', and Y', which is called a basic arrangement (XZ', YX', ZY');

a twelfth arrangement: an arrangement rotating the EUT by 45 degree in the counter-clockwise about Y-axis in said eleventh arrangement;

a thirteenth arrangement: an arrangement rotating the EUT by 45 degree in the counter-clockwise about Y-axis in said twelfth arrangement;

a fourteenth arrangement: an arrangement rotating the EUT by 90 degree in the counter-clockwise about Y-axis in said thirteenth arrangement;

a fifteenth arrangement: an arrangement rotating the EUT by 90 degree in the counter-clockwise about Y-axis in said fourteenth arrangement.

3. The method for estimating radiated emission level from an EUT at an arbitrary position on the turn table at OATS according to claim 2, wherein when said GTEM cell output port powers of the first through fifteenth arrangements relative to said measuring variable n are respectively P1(f) through P15(f) at the frequency f, said power measuring method relative to 15 arrangements comprises steps of:

initializing a measuring variable as n=0, m=n+2, based the object on a basic arrangement(XX', YY', ZZ');

increasing said n value by 1 and measuring a power Pn(f) (n illustrates arrangement number as the measuring variable);

performing said step again for rotating the EUT by 45 degree in the counter-clockwise about a giga-herz transverse electromagnetic cell (GTEM cell) coordinate axis Y if n is not greater than m upon comparing said n(=1) with m(=2); and performing the same step until said n is 2, the respective arrangement numbers (n), 1 through 5 illustrating arrangements whose the object is rotated by 0, 45, 90, 180, and 270 degrees relative to Y-axis from a basic arrangement(XX', YY',ZZ') until n is 5 after said n is 3($\Phi$ is increasing 90).

4. The method for estimating radiated emission level from an EUT at an arbitrary position on the turn table at OATS according to claim 2, wherein when said GTEM cell output port powers of the first through fifteenth arrangements relative to said measuring variable n are respectively P1(f) through P15(f) at the frequency f, said method comprises a step of measuring P6(f) through P10(f) at the arrangement rotating the object by 0, 45, 90, 180, and 270 degrees relative to Y-axis from a basic arrangement(XY', YZ',ZX') when n is 5.

5. The method for estimating radiated emission level from an EUT at an arbitrary position on the turn table at OATS according to claim 2, wherein when said GTEM cell output port powers of the first through fifteenth arrangements relative to said measuring variable n are respectively P1(f) through P15(f) at the frequency f, said method comprises a step of measuring P11(f) through P15(f) at the arrangement rotating the object by 0, 45, 90, 180, and 270 degrees about Y-axis from a basic arrangement(XZ', YX',ZY') when n is 10.

6. A method for estimating radiated emission level from an EUT at an arbitrary position on the turn table at OATS, wherein said EUT is supposed as electric and magnetic dipole moments $P(=P_x e^{j\psi_{px}}a_x + P_y e^{j\psi_{py}}a_y + P_z e^{j\psi_{pz}}a_z)$, where, $a_x$, $a_y$, $a_z$ are respectively the unit vectors, in the directions of x, y and z) and $M(=M_x e^{j\psi_{mx}}a_x + M_y e^{j\psi_{my}}ea_y + M_z e^{j\psi_{mz}}a_z)$ with initial phases to the respective components, and has a correlation with the GTEM cell output powers of [Equation 20] in order to compute vertical and horizontal radiation electric fields from the object on the ground plane of OATS or SAC

[Equation 20]

(a) $P_z^2 + k_0^2 M_y^2 = \dfrac{P_1(f) + P_4(f)}{2}$ (b) $P_z^2 + k_0^2 M_x^2 = \dfrac{P_3(f) + P_5(f)}{2}$ (c) $k_0 P_z M_y \sin(\Psi_{pz} - \Psi_{my}) = \dfrac{P_4(f) - P_1(f)}{4}$ (d) $k_0 P_z M_x \sin(\Psi_{pz} - \Psi_{my}) = \dfrac{P_5(f) - P_3(f)}{4}$ (e) $k_0^2 M_x M_y \cos(\Psi_{mx} - \Psi_{my}) =$ $P_2(f) \dfrac{P_1(f) + P_3(f) + P_4(f) + P_5(f)}{4} -$ $\dfrac{\sqrt{2(P_1(f) + P_3(f) - P_4(f) - P_5(f))}}{4}$ (f) $P_x^2 + k_0^2 M_z^2 = \dfrac{P_6(f) + P_9(f)}{2}$ (g) $P_x^2 + k_0^2 M_y^2 = \dfrac{P_8(f) + P_{10}(f)}{2}$ (h) $k_0 P_x M_z \sin(\Psi_{px} - \Psi_{mz}) = \dfrac{P_9(f) - P_6(f)}{4}$ (i) $k_0 P_x M_y \sin(\Psi_{px} - \Psi_{mz}) = \dfrac{P_{10}(f) - P_8(f)}{4}$ (j) $k_0^2 M_y M_z \cos(\Psi_{my} - \Psi_{mz}) =$ $P_7(f) \dfrac{P_6(f) + P_8(f) + P_9(f) + P_{10}(f)}{4} -$ $\dfrac{\sqrt{2(P_6(f) + P_8(f) - P_9(f) - P_{10}(f))}}{4}$ (k) $P_y^2 + k_0^2 M_x^2 = \dfrac{P_{11}(f) + P_{14}(f)}{2}$ (l) $P_y^2 + k_0^2 M_z^2 = \dfrac{P_{13}(f) + P_{15}(f)}{2}$ (m) $k_0 P_y M_x \sin(\Psi_{py} - \Psi_{mx}) = \dfrac{P_{14}(f) - P_{11}(f)}{4}$ (n) $k_0 P_y M_z \sin(\Psi_{py} - \Psi_{mx}) = \dfrac{P_{15}(f) - P_{13}(f)}{4}$ (o) $k_0^2 M_x M_z \cos(\Psi_{mx} - \Psi_{mz}) =$ $P_{12}(f) \dfrac{P_{11}(f) + P_{13}(f) + P_{14}(f) + P_{15}(f)}{4} -$ $\dfrac{\sqrt{2(P_{11}(f) + P_{13}(f) - P_{14}(f) - P_{15}(f))}}{4}$.

7. The method for estimating radiated emission level from an EUT at an arbitrary position on the turn table at OATS according to claim 6, wherein the GTEM cell output powers and dipole moments, that is electromagnetic model of the EUT required to obtain a vertical electric field from the EUT on the ground plane of said OATS or SAC require valuse of $P_z^2 + k_0^2 M_y^2, P_z^2 + k_0^2 M_x^2$ $k_0 P_z M_y \sin(\psi_{pz} - \psi_{my}), k_0 P_z M_x \sin(\psi_{pz} - \psi_{mx}), k_0^2 M_x M_y \cos(\psi_{mx} - \psi_{my})$, these values are correlated with coupled terms of 5 powers of $P_1(f)$ through $P_5(f)$ measured at the GTEM cell output ports, said $P_z^2 + k_0^2 M_y^2$ is a value dividing an addition of $P_1(f)$ to $P_4(f)$ into 2, said $P_z^2 + k_0^2 M_x^2$ is a value dividing an addition of $P_3(f)$ to $P_5(f)$ into 2, said $k_0 P_z M_y \sin(\psi_{pz} - \psi_{my})$ is a value dividing a subtraction of $P_4(f)$ from $P_1(f)$ into 4, said $k_0 P_z M_x \sin(\psi_{pz} - \psi_{mx})$ is a value dividing a subtraction of $P_5(f)$ from $P_3(f)$ into 4, if a value of multiplying $\sqrt{2/4}$ by the subtracted value is TMP1 upon subtracting the addition of $P_4(f)$ and $P_5(f)$ from the addition of $P_1(f)$ and $P_3(f)$ $k_0^2 M_x M_y \cos(\psi_{mx}-\psi_{my})$ has correlating (herein, $k_0$ is a transfer constant from a free space) the object modelled as the dipole moment with GTEM cell output power upon replacing an equivalent value of subtracting TMP1 value from a mean value of $P_1(f)$, $P_3(f)$, $P_4(f)$, $P_5(f)$ from $P_2(f)$.

8. The method for estimating radiated emission level from an EUT at an arbitrary position on the turn table at OATS according to claim 6, wherein dipole moments, that is, GTEM cell output power and an electromagnetic model of the object required to obtain a horizontal electric field from the object on the grounded surface of said OATS or SAC require values of $P_x^2+k_0^2 M_z^2$, $P_x^2+k_0^2 M_y^2$, $k_0 P_x M_z \sin(\psi_{px}-\psi_{mz})$, $k_0 P_x M_y \sin(\psi_{px}-\psi_{my})$, $k_0^2 M_y+M_z\cos(\psi_{my}-\psi_{mz})$, $P_y^2+k_0^2 M_x^2$, $P_y^2+k_0^2 M_z^2$, $k_0 P_y M_x \sin(\psi_{py}-\psi_{mx})$, $k_0 P_y M_z \sin(\psi_{py}-\psi_{mz})$, $k_0^2+M_x M_z \cos(\psi_{mx}-\psi_{mz})$, these values are correlated with connective terms of 10 powers of $P_6(f)$ through $P_{15}(f)$ measured from GTEM cell output ports, said $P_x^2+k_0^2 M_z^2$ is a value dividing an addition of $P_6(f)$ to $P_9(f)$ into 2, said $P_x^2+k_0^2 M_y^2$ is a value dividing an addition of $P_8(f)$ to $P_{10}(f)$ into 2, said $k_0 P_x M_y \sin(\psi_{px}-\psi_{my})$ is a value dividing a subtraction of $P_6(f)$ from $P_9(f)$ into 4, said $k_0 P_x M_y \sin(\psi_{px}-\psi_{my})$ is a value dividing a subtraction of $P_8(f)$ from $P_{10}(f)$ into 4, if a value of multiplying $\sqrt{2/4}$ by the subtracted value is TMP2 upon subtracting an addition of $P_9(f)$ and $P_{10}(f)$ from an addition of $P_6(f)$ and $P_8(f)$, $k_0^2+M_x M_z \cos(\psi_{mx}-\psi_{mz})$ has similarly correlating 5 powers $P_{11}(f)$ through $P_{15}(f)$ with the scalar and phase of the dipole moment with the GTEM cell output power upon replacing an equivalent value of subtracting TMP2 value from a mean value of $P_6(f)$, $P_8(f)$, $P_9(f)$, $P_{10}(f)$ from $P_7(f)$, said $P_y^2+k_0^2 M_x^2$ is a value dividing an addition of $P11(f)$ to $P_{14}(f)$ into 2, said $P_y^2+k_0^2 M_z^2$ is a value dividing an addition of $P_{13}(f)$ to $P_{15}(f)$ into 2, said $k_0 P_y M_x \sin(\psi_{py}-\psi_{mx})$ is a value dividing a subtraction of $P_{11}(f)$ from $P_{14}(f)$ into 4, said $k_0 P_y M_z \sin(\psi_{py}-\psi_{mz})$ is a value dividing a subtraction of $P_{13}(f)$ from $P_{15}(f)$ into 4, if a value of multiplying $\sqrt{2/4}$ by the subtracted value is TMP3f upon subtracting an addition of $P_{14}(f)$ and $P_{15}(f)$ from an addition of $P_{11}(f)$ and $P_{13}(f)$, $k_0^2+M_x M_z \cos(\psi_{mx}-\psi_{mz})$ has correlating a horizontal electric field radiated from the object modeled as the dipole moment with GTEM cell output power upon replacing an equivalent value of subtracting TMP3 value from a mean value of $P_{11}(f)$, $P_{13}(f)$, $P_{14}(f)$, $P_{15}(f)$ from $P_{12}(f)$.

9. The method for estimating radiated emission level from an EUT at an arbitrary position on the turn table at OATS according to claim 6, wherein the radiation electric field from the object over the ground plane of said OATS or SAC is that when the vertical axis of the coordinate on the OATS is z-axis if said object is positioned at (xx,yy) on the turn table of OATS the vertical and horizontal electric fields from an observing point (a space point on OATS where users want to compute the radiation electric field)(X, Y, Z) are obtained from the following (Equation 21) and (Equation 22)

$$|E_v|^2 \approx \left(\frac{\eta_0 k_0}{4\pi}\right)^2 \{K_v\} \qquad [\text{Equation 21}]$$

$$K_v = K_{vR_1} + K_{vR_2} + K_{vcos}$$

$$K_{vR_1} = \frac{1}{R_1^2}\left[\begin{array}{l}(P_z^2+k_0^2 M_x^2)\left(\frac{(y-yy)}{R_1}\right)^2 + (P_z^2+k_0^2 M_y^2)\left(\frac{(x-xx)}{R_1}\right)^2 - \\ 2k_0^2 \frac{(x-xx)(y-yy)}{R_1^2} M_x M_y C_{mxy} + 2k_0\left(\frac{(y-yy)}{R_1} P_z M_x S_{zx} - \frac{(x-xx)}{R_1} P_z M_y S_{zy}\right)\end{array}\right]$$

$$K_{vR_2} = \frac{1}{R_2^2}\left[\begin{array}{l}(P_z^2+k_0^2 M_x^2)\left(\frac{(y-yy)}{R_2}\right)^2 + (P_z^2+k_0^2 M_y^2)\left(\frac{(x-xx)}{R_2}\right)^2 - \\ 2k_0^2 \frac{(x-xx)(y-yy)}{R_2^2} M_x M_y C_{mxy} + 2k_0\left(\frac{(y-yy)}{R_2} P_z M_x S_{zx} - \frac{(x-xx)}{R_2} P_z M_y S_{zy}\right)\end{array}\right]$$

$$K_{vcos} = 2\cos[k_0(R_1 - R_2)]$$

$$\left(\frac{1}{R_1 R_2}\right)^2 \cdot \left[\begin{array}{l}(P_z^2+k_0^2 M_x^2)(y-yy)^2 + (P_z^2+k_0^2 M_y^2)(x-xx)^2 - 2k_0^2(x-xx)(y-yy)M_x M_y C_{mxy} + \\ k_0(R_1+R_2)\cdot((y-yy)P_z M_x S_{zx} - (x-xx)P_z M_y S_{zy})\end{array}\right]$$

$$|E_h|^2 \approx \left(\frac{\eta_0 k_0}{4\pi}\right)^2 \{K_h\} \qquad [\text{Equation 22}]$$

$$K_h = K_{hR_1} + K_{hR_2} + K_{hcos}$$

$$K_{hR_1} = \frac{1}{R_1^2}\left[\begin{array}{l}(P_x^2+k_0^2 M_y^2)\left(\frac{z_1}{R_1}\right)^2 + (P_y^2+k_0^2 M_x^2)\left(\frac{z_1}{R_1}\right)^2 + \\ (P_x^2+k_0^2 M_z^2)\left(\frac{(x-xx)}{R_1}\right)^2 + \\ (P_y^2+k_0^2 M_z^2)\left(\frac{(y-yy)}{R_1}\right)^2 - \\ 2k_0^2\left(\frac{(y-yy)z_1}{R_1^2} M_y M_z C_{myz} + \right. \\ \left.\frac{(x-xx)z_1}{R_1^2} M_x M_z C_{mxz}\right) + \\ 2k_0\left(\begin{array}{l}\frac{z_1}{R_1}(P_x M_y S_{xy} - P_y M_x S_{yx}) - \\ \frac{(y-yy)}{R_1} P_x M_z S_{xz} + \\ \frac{(x-xx)}{R_1} P_y M_z S_{yz}\end{array}\right)\end{array}\right]$$

$$K_{hR_2} = \frac{1}{R_2^2} \begin{bmatrix} (P_x^2 + k_0^2 M_y^2)\left(\frac{z_2}{R_2}\right)^2 + (P_y^2 + k_0^2 M_x^2)\left(\frac{z_2}{R_2}\right)^2 + \\ (P_x^2 + k_0^2 M_z^2)\left(\frac{(x-xx)}{R_2}\right)^2 + \\ (P_y^2 + k_0^2 M_z^2)\left(\frac{(y-yy)}{R_2}\right)^2 + \\ 2k_0^2\left(\frac{(y-yy)z_2}{R_2^2} M_y M_z C_{myz} + \right. \\ \left. \frac{(x-xx)z_2}{R_2^2} M_x M_z C_{mxz}\right) + \\ 2k_o \begin{pmatrix} \frac{z_2}{R_2}(P_y M_x S_{yx} - P_x M_y S_{xy}) - \\ \frac{(y-yy)}{R_2} P_x M_z S_{xz} + \\ \frac{(x-xx)}{R_2} P_y M_z S_{yz} \end{pmatrix} \end{bmatrix}$$

$$K_{hcos} = 2\cos[k_0(R_1 - R_2)]\left(\frac{1}{R_1 R_2}\right)^2 \cdot \begin{bmatrix} k_0^2[M_x M_z C_{myz}((y-yy)z_1 - (y-yy)z_2) + \\ M_x M_y C_{mxy}((x-xx)z_1 - (x-xx)z_2)] + \\ k_0(R_1 z_2 - R_2 z_1)(P_x M_y S_{xy} - P_y M_x S_{yx}) + \\ (R_1 + R_2)(y-yy) P_x M_z S_{xz} - \\ (x-xx) P_y M_z S_{yz} \end{bmatrix}$$

10. The method for estimating radiated emission level from an EUT at an arbitrary position turn table at OATS according to claim 7, wherein 15 dipole moment related terms and 15 GTEM cell output port powers in the middle of the radiation electric field from the object of said OATS have a correlation as (Equation 23)

(a) $P_z^2 + k_0^2 M_y^2 = \dfrac{P_1(f) + P_4(f)}{2}$ [Equation 23]

(b) $P_z^2 + k_0^2 M_x^2 = \dfrac{P_3(f) + P_5(f)}{2}$ (c) $k_0 P_z M_y \sin(\Psi_{pz} - \Psi_{my}) = \dfrac{P_4(f) - P_1(f)}{4}$ (d) $k_0 P_z M_x \sin(\Psi_{pz} - \Psi_{my}) = \dfrac{P_5(f) - P_3(f)}{4}$ (e) $k_0^2 M_x M_y \cos(\Psi_{mx} - \Psi_{my}) =$ $P_2(f) \dfrac{P_1(f) + P_3(f) + P_4(f) + P_5(f)}{4} - \dfrac{\sqrt{2(P_1(f) + P_3(f) - P_4(f) - P_5(f))}}{4}$ (f) $P_x^2 + k_0^2 M_z^2 = \dfrac{P_6(f) + P_9(f)}{2}$ (g) $P_x^2 + k_0^2 M_y^2 = \dfrac{P_8(f) + P_{10}(f)}{2}$ (h) $k_0 P_x M_z \sin(\Psi_{px} - \Psi_{mz}) = \dfrac{P_9(f) - P_6(f)}{4}$ (i) $k_0 P_x M_y \sin(\Psi_{px} - \Psi_{my}) = \dfrac{P_{10}(f) - P_8(f)}{4}$ (j) $k_0^2 M_y M_z \cos(\Psi_{my} - \Psi_{mz}) =$ $P_7(f) \dfrac{P_6(f) + P_8(f) + P_9(f) + P_{10}(f)}{4} - \dfrac{\sqrt{2(P_6(f) + P_8(f) - P_9(f) - P_{10}(f))}}{4}$ (k) $P_y^2 + k_0^2 M_x^2 = \dfrac{P_{11}(f) + P_{14}(f)}{2}$ (l) $P_y^2 + k_0^2 M_z^2 = \dfrac{P_{13}(f) + P_{15}(f)}{2}$ (m) $k_0 P_y M_x \sin(\Psi_{py} - \Psi_{mx}) = \dfrac{P_{14}(f) - P_{11}(f)}{4}$ (n) $k_0 P_y M_z \sin(\Psi_{py} - \Psi_{mx}) = \dfrac{P_{15}(f) - P_{13}(f)}{4}$ (o) $k_0^2 M_x M_z \cos(\Psi_{mx} - \Psi_{mz}) =$ $P_{12}(f) \dfrac{P_{11}(f) + P_{13}(f) + P_{14}(f) + P_{15}(f)}{4} - \dfrac{\sqrt{2(P_{11}(f) + P_{13}(f) - P_{14}(f) - P_{15}(f))}}{4}.$

* * * * *